Sept. 6, 1966 N. BERMAN ETAL 3,271,715

RESILIENTLY MOUNTED CONTACT SLIDABLE ON INDUCTIVE COIL

Original Filed April 18, 1962 4 Sheets-Sheet 1

INVENTORS
NELSON BERMAN
HUGO SEIDEN
BY
Blum, Moscovitz, Friedman, Blum & Kaplan
ATTORNEYS.

RESILIENTLY MOUNTED CONTACT SLIDABLE ON INDUCTIVE COIL

Original Filed April 18, 1962 4 Sheets-Sheet 2

INVENTORS
NELSON BERMAN
HUGO SEIDEN

RESILIENTLY MOUNTED CONTACT SLIDABLE ON INDUCTIVE COIL

Original Filed April 18, 1962 4 Sheets-Sheet 3

INVENTORS
NELSON BERMAN
HUGO SEIDEN

INVENTORS
NELSON BERMAN
HUGO SEIDEN

United States Patent Office 3,271,715

Patented Sept. 6, 1966

3,271,715

RESILIENTLY MOUNTED CONTACT SLIDABLE ON INDUCTIVE COIL

Nelson Berman, New Hyde Park, and Hugo Seiden, Brooklyn, N.Y., and Joseph R. Roy, Wapping, Conn., assignors to JFD Electronics Corporation, Brooklyn, N.Y., an organization of New York Original application Apr. 18, 1962, Ser. No. 188,458. Divided and this application May 7, 1965, Ser. No. 462,466

2 Claims. (Cl. 336—137)

This application is a division of the applicants' copending parent application, serial No. 188,458 filed April 18, 1962, which has been abandoned.

This invention relates to improvements in ganged tuning devices, and in particular relates to an improved ganged tuning device wherein the individual tuning elements are of the slug or plunger type.

One object of this invention is to provide a ganged slug or plunger tuning device which is mechanically easy and economical to manufacture and assemble, with a minimum of mechanical and electrical alignment problems.

Another object of this invention is to provide a tuning device of the above-described type which provides simple automatic means for compensating for misalignment of respective tuning plungers or slugs in the tubular shells in which they slide.

Another object of the invention is to provide improved bearing means for the main drive shaft of a ganged tuning device or other device, so that the drive shaft is free from backlash.

Another object of the invention is to provide improved means for stopping the turning of the main drive shaft of a ganged tuning device or other device, at the extreme limits of the desired range of turning of such main drive shaft, so as to prevent damage to the drive mechanism and limit the tuning range.

Another object of the invention is to provide a ganged slug or plunger tuning device, the resonance frequency tolerance or each individual tuning device being extremely low.

Another object of the invention is to provide a tuning device of the above type wherein the frequency as a function of angle rotation of the main drive shaft can readily be controlled: for example, by having the frequency change linearly with respect to angle of rotation.

Another object of the invention is to provide a multiganged tuner which may be readily designed so as to have desired electrical characteristics: for example, resonant frequency as a linear function of control shaft rotation, and constant ratio of inductance to capacity of each capacity-inductance section at all resonance frequencies.

Another object of the invention is to provide an improved tuner with reduced microphonics under conditions of vibration encountered during operation.

Another object of the invention is to provide a tuner of the above-described type having simple independent means for adjusting or trimming each capacitive or inductive element.

Another object of the invention is to provide an improved inductance tuning element for use in a tuner of the above-described type.

Another object of this invention is to provide a multiganged tuner which is considerably smaller than plate meshing air dielectric capacitors commonly used.

In accordance with preferred embodiments of the invention, the tuning device comprises an enclosed cylindrical housing of selected cross sectional configuration having a longitudinal axis and front and rear end walls, as well as a transverse partition fixedly mounted in the housing intermediate said end walls.

The device further comprises a plurality of longitudinally extending reactance tubes fixed to the partition on the rear thereof. Some or all of these tubes may be capacitor tubes made of dielectric material and having a conductive coating between concentric layers of the dielectric material. Some or all of these tubes may be inductance tubes made of insulating material and having a helically wound wire embedded in the wall of the bore thereof.

In accordance with the invention, there is further provided an axially extending drive shaft which extends through appropriate bearings of the partition and the front wall. The drive shaft also extends forwardly of the front wall and is there provided with a knob for turning purposes. There is further provided a transverse plate axially slidably and non-rotatably mounted in the housing between the partition and the front wall and coupled to the drive shaft for axial movement of the transverse plate in response to turning of the drive shaft.

Stiff wires are mounted on the plate so as to extend longitudinally rearwardly thereof, with the position of each wire being individually adjustable for trimming purposes. The wires extend respectively into the respective tubes and are transversely suitably flexible and resilient. A slug member is mounted on the end of each wire within its associated tube. In the case of the capacitative reactor, the slug member may be in the form of a conductive hollow piston. In the case of an inductance element, the slug member may be in the form of a flat disc which makes wiping contact with the spirally mounted wire inside the tube. The conductive coatings and the spirally wound wires are respectively shaped in any desired manner so as to produce varying electric capacity and inductance characteristics of the reactance elements as the result of axial movement of the slug elements. Further, the various reactance elements may be electrically combined in external circuits so as to provide any desired reactance combinations.

As an important feature of the invention, the wires can flex somewhat so as to accommodate misalignments of the wires, or of the mechanism generally, relative to the tubes during axial movement of the plate. This permits the desired tight fit of the slug elements within the tube to decrease the air gap, to reduce piston flutter during vibration and to reduce microphonics, while, at the same time, minimizing the need for accurate machining of the assembly which carries the slug elements.

It is extremely important, in a tuning device of this type, to prevent backlash of the control shaft. Such prevention of backlash can also be important in other devices. In accordance with one preferred embodiment of the invention, the control shaft has a helical square-shaped groove and an outer periphery. A driven collar member is coupled to the aforesaid plate which carries the wires which support the slug elements. A further collar member is also mounted upon the control shaft and is longitudinally displaced from the driven collar member. These collar members are longer than the width of the helical groove. The collar members are non-rotatably coupled by a spring or the like which urges the collar members in opposite direction. Bearing means are respectively mounted on the respective collar members and extend slidably into the spiral groove and engage rollingly against the respective side walls of the groove. The action of the spring maintains the respective bearing means frictionally against the respective walls of the groove so as to prevent backlash of the shaft relative to the driven collar member.

Other objects and advantages of the invention will become apparent from the following description, in conjunction with the annexed drawings, in which preferred embodiments of the invention are disclosed.

Figures 1, 2, 4, 5:
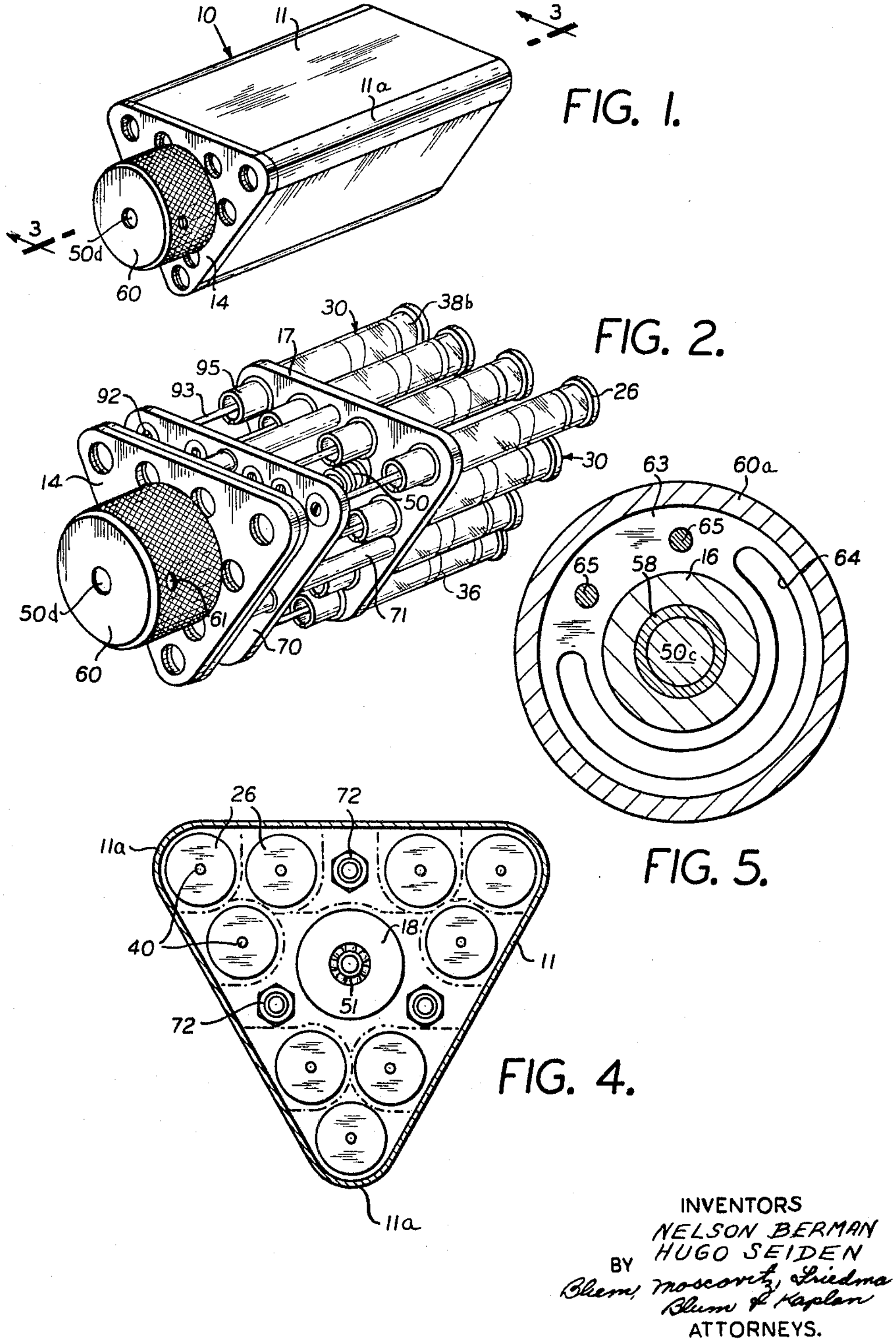
FIG. 1 is a perspective view of a tuner in accordance with this invention.
FIG. 2 is a view similar to FIG. 1, but with the peripheral wall of the housing removed and drawn to a somewhat enlarged scale.
FIG. 4 is a section on line 4—4 of FIG. 3.
FIG. 5 is a section on line 5—5 of FIG. 3.

Upon reference to the drawings in detail, it will be noted that they show a longitudinally extending housing 10 having a peripheral wall 11 which is shown as generally triangular in cross section with rounded corners 11*a*. However, as will be explained in somewhat more detail below, any convenient cross sectional shape of the housing peripheral wall 11 may be provided. Said housing 10 may be made of metal or any other suitable material. Housing 10 has a rear closure wall 15, shown in FIG. 3, which is optionally integral with side peripheral wall 11. Housing 10 has a front closure wall 14 which overlies the front edge of peripheral wall 11 and which has a rear boss 14*a* which extends frictionally into peripheral wall 11. Said front wall 14 is secured to peripheral wall 11 by any suitable sealing means (not shown), enabling housing 10 to be sealed against dust and other external conditions.

The tuning device further comprises a transverse partition wall 17 which is fixed in place within the peripheral wall intermediate the end walls 14 and 15.

Partition 17 has a central opening 17*a*, the rear portion 17*b* of which is of increased diameter. Hollow, cylindrical, axially extending body 18 is positioned in the compartment 20 between partition 17 and rear wall 15, said body 18 extending frictionally into opening portion 17*b* and against the shoulder between hole portions 17*a* and 17*b*. Body 18 has a thick rear transverse wall 18*a*.

In addition to the body 18, a plurality of reactance tubes 30 and 31 are also disposed within compartment 20. Illustratively, nine tubes are shown; but this number may be varied. Optionally, only tubes 30 or only tubes 31 may be used. Illustratively, the drawings show eight tubes 30 and one tube 31.

Figures 3, 6, 7:
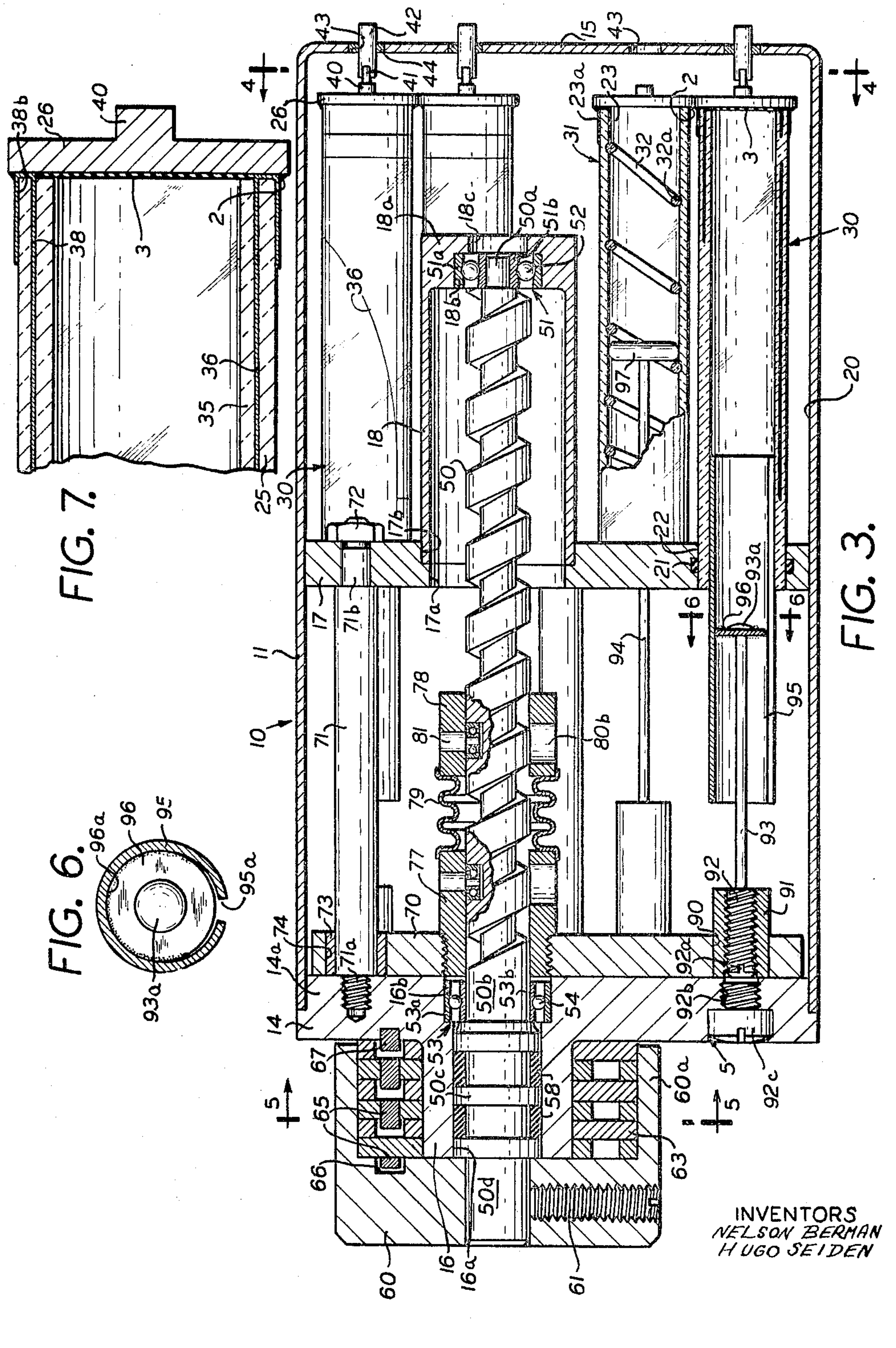
FIG. 3 is a longitudinal sectional line 3—3 of FIG. 1.
FIG. 6 is a detail section on lines 6—6 of FIG. 3.
FIG. 7 is a fragmentary detail view similar to FIG. 3, showing a portion of one of the capacitor elements in an enlarged scale.

Each said tube 30 or 31 is made of an appropriate dielectric material, such as glass, although it will be apparent that the tube 31, which is part of an inductance, can be made of any suitable insulating material. The front end of each said tube 30 and 31 extends frictionally into an appropriate aperture 22 of partition 17, as shown in FIG. 3. Tube 30 or 31 as the case may be, is soldered within the aperture 22 in which it is received, by means of a ring of solder 21 which extends into an appropriate annular groove of partition 17 opening upon aperture 22. In other words, the soldering securing the tube to the partition is received internally within the partition. Each said tube 30 or 31 extends longitudinally rearwardly from partition 17 to a point spaced slightly forwardly of rear wall 15.

Each inductance tube 31 has a metal coil 32 in the bore thereof. The successive turns of coil 32 are embedded to approximately half the diameter of the wire in a complementary groove 32*a* formed in the tube wall. The pitch of the turns of coil 32 has a selected variation corresponding to the desired inductance curve of the device. Illustratively, the longitudinal spacing between successive turns of coil 32 is shown as increasing from front to rear.

At the rear of tube 31, a conductive coating 23 is deposited on the inside of the bore of the tube, in contact with the rear end of the wire 32. Said coating 23 extends around the rear end of the tube and then forms a coating 23*a* around the outside thereof.

Each tube 30 includes an inner glass tubular portion 35 upon which is provided an outer conductive coating 36. The tube 35 and its coating 36 are further intimately coated by an outer tubular layer 25, also of glass. Said coating 36 has a selected configuration corresponding to the desired capacitance curve of the device. Thus, as illustratively shown in FIG. 3, the coating 36 may be cut away at the front so as to vary the circumferential extent of the coating, such variation occurring from minimum circumferential extent adjacent partition 17 to a rearward point at which the coating extends completely around the periphery of the tube. Behind this point, the coating 36 communicates with a coating band 38 which is cylindrical and which is between the layers 35 and 25 and which extends to the rear end of tube 30. At the rear end of the tube, the coating 38 is extended outwardly over the rear end of the outer tube portion 25 and then is further extended around the outer periphery of tube portion 25 to form a cylindrical outer band 38*b*. The rear end of of each of the tubes 30 and 31 is closed by a transverse metal end cap 26 which makes electrical contact with the conductive band 38*b* or 23*a*, as the case may be. Cap 26 is secured to the outside of band 38*b* or 23*a* by means of solder 2. Inwardly of coating 38 or 23, the front face of cap 26 is covered by insulating disc 3 which prevents electrical contact between piston 95 or disc 97 and cap 26. Said end cap 26 has a rear terminal boss 40 which is connected by wire 41 to a metal connector 42 which extends through an aperture 43 in the rear wall 15, said connector 42 being sealed in said aperture 43 by a gasket 44. Rearwardly of wall 15, the wires 42 may be connected in any desired circuit arrangement.

In accordance with the invention, there is provided an axially extending drive shaft 50 and bearing means for said drive shaft 50. Specifically, an aperture 18*c* is formed centrally in wall 18*a*, the front portion of aperture 18*c*, designated by the reference numeral 18*b*, being of increased diameter. A ball bearing assembly 51 is fixed within the aperture portion 18*b* having an outer race 51*a*, an inner race 51*b*, mounted upon reduced rear end portion 50*a* of shaft 50, and the usual balls 52 between the races.

Further bearing means and sealing means are provided in wall 14. Said wall 14 has a central, cylindrical axial front boss 16. A through bore 16*a* extends through boss 16 and wall 14, the rear end 16*b* of bore 16*a* being of increased diameter. A ball bearing assembly 53 is mounted in bore portion 16*b* having an outer race 53*a* and an inner race 53*b* attached to shaft portion 50*b*. The two races are coupled by the usual balls 54. Shaft portion 50*c* extends forwardly of bearing assembly 53 and extends turnably through bore 16*a*, said shaft portion 50*c* having annular grooves in which sealing O-rings 58 are received.

Shaft portion **50*d* extends forwardly of shaft portion 50*c*. Knurled knob 60 is fixedly mounted upon shaft portion 50*d* by means of a set screw 61. Cylindrical flange 60*a* extends rearwardly from knob 60, almost to wall 14, and is radially spaced from shaft portion 50*c*. A plurality of circular discs (FIGS. 3 and 5) are turnably mounted upon boss 16 and are turnable within flange 60*a*. Each disc 63 has a part-circular slot 64, illustratively 270° in length as shown in FIG. 5. Longitudinally extending pins 65 are fixed to the front face of each disc 63, in circumferential alignment with slot 64, and symmetrically placed circumferentially with respect to slot 64. There are two such pins 65**, illustratively spaced 60° apart as shown in FIG. 5.

The pins 65 of each disc 63 extend slidably into the slot 64 of disc 63 just in front thereof, as shown in FIG. 3. The pins 65 of the front discs 63 similarly extend into a groove 66 on the rear face of knob 60 which corresponds to slots 64. Similarly, pins 67 on the front face of wall 14 extend into the slots 64 of the rear disc 63.

It will be apparent that a limit of turning of one disc relative to another is reached when an appropriate pin 65 strikes an appropriate end of slot 64. Illustratively, six discs 63 are shown in FIG. 3. By slight variation of one or more slots 64 or groove 66, or by slight variation of spacing of one or more pairs of pins 65 or of pins 67, the total angular movement of knob 60 may illustratively be 1,440° or four turns. While this range of movement has been found convenient, the invention is not limited to this range. In any event, it will be apparent that a positive stop is provided against the turning of shaft 50 at the limits of its angular rotation. It will further be apparent that the number of discs or dimensions of slots may be varied to obtain any desired range of angular movement of shaft 50.

Also, in accordance with the invention, transverse plate 70 is mounted within the casing axially slidably but non-rotatably, between partition 17 and front wall 14. In order to support plate 70, a plurality of longitudinally extending rods 71 are extended between wall 14 and partition 17. Each rod 71 has a front end screw-threaded extension **71*a* of reduced diameter which is screwed into an appropriate screw-threaded bore of wall 14, and a rear extension 71*b* of reduced diameter which extends through an appropriate aperture of wall 17 and a screw-threaded rearwardly thereof to receive nut 72. Said rods 71, accordingly, not only serve as guides for plate 70 but also serve to secure partition 17** rigidly in place.

Said rods 71 extend slidably through respective sleeve bearings 73 in respective apertures 74 in plate 70 and accordingly permit axial movement of plate 70.

In accordance with the invention, improved means are provided for coupling shaft 50 to plate 70. Specifically, as particularly shown in FIGS. 8, 9 and 10, shaft 50 is provided with a deep and wide spiral groove 75 which is square in that the sides of the groove are substantially perpendicular to the axis of shaft 50. Said groove 75 extends from shaft portion **50*b* to shaft portion 50*a*. Plate 70 has a screw-threaded through bore 76, centrally located. A driven collar member 77 abuts the rear face of plate 70 and has a forward screw-threaded coaxial extension 77*a* of reduced diameter which is screwed into bore 76. Collar 77 and its extension 77*a* have a common through bore 77*b* through which the outer periphery 75*a* of shaft 50** extends turnably.

A further collar member 78 is located rearwardly of collar 77 and in axial alignment therewith and has a bore **78*a* through which the outer periphery 75*a* of shaft 50 extends turnably. The collar members 77 and 78 are axially spaced. Any appropriate spring means may be employed so as to couple the two collar members 77 and 78 non-rotatably while urging the two collar members in opposite direction. In this embodiment, and without limitation thereto, said spring takes the form of a metal bellows 79 through the bore 79*a* of which the shaft outer periphery 75*a* extends clearingly. The respective ends of the bellows 79 extend around and are fixed by any suitable means to the peripheries of driven collar member 77 and further collar member 78. Bellows 79 is expansible in the usual way so as to urge the collar members 77 and 78 away from each other, but said bellows substantially resists torque and thereby prevents relative rotation of the members 77 and 78**.

Said collar members 77 and 78 have parallel radial through bores 80. A pin 81 extends through each bore 80 and is fixed therein by any suitable means (not shown). The inner end of each pin 81 is tapered at **81*a* and is fixed to one end face of the inner race 82*a* of a ball bearing assembly 82. Bearing assembly 82 has the usual circular outer race 82*b* coupled to the inner race by the usual balls 83. Each bearing assembly 82 is received within groove 75, and the races 82*a* and 82*b* turn about a radial axis. For aid in assembly, collars 77 and 78 respectively optionally have radial through bores 80*b* diametrically aligned with bores 80**.

The diameter of the outer peripheral surface of race **82*b* is less than the width of groove 75. Accordingly, as clearly shown in FIG. 8, the spring 79 urges the races 82*b* oppositely into engagement against opposite faces of the groove. It will be apparent that when shaft 50 turns, the respective surfaces of groove 75 frictionally engage the peripheries of the respective races 82*b* causing them to turn on their ball bearings. This causes the frontmost race 82*b* to travel in the groove 75, thereby carrying the driven collar member 77 in direction corresponding to the direction of turning of shaft 50. Of course, the plate 70 moves forwardly or rearwardly in unison with the movement of driven collar member 77. The provision of the second collar member 78 and spring 79 insures the frictional engagement of the front race 82*b* with the wall of the groove 75 so as to insure that there will be no backlash, with rotary movement of shaft 50 being instantly communicated to the driven collar member 77**. The provision of the bearing assemblies insures that they will move smoothly in the groove without slippage. The arrangement of a rolling member is superior to the usual arrangement in which a driven member has a rigid protuberance riding in the groove. An additional advantage of the bearing shaft arrangement is its long life.

Figure 11:
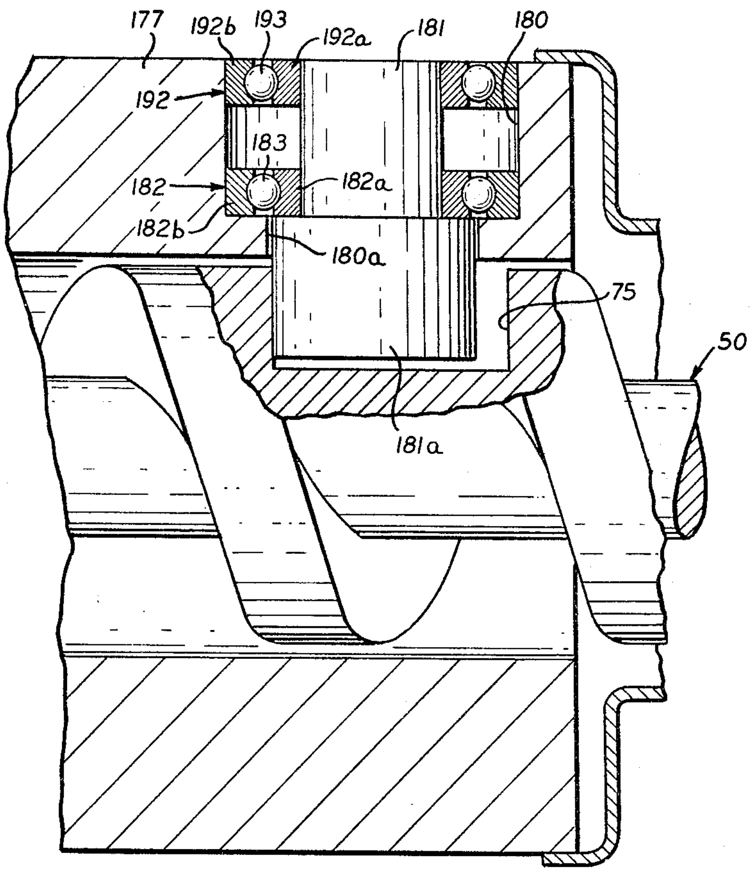
FIG. 11 is a view similar to FIG. 9, showing a modified form of the invention.

In the modification of FIG. 11, only the assembly associated with bushing or collar 177 (corresponding to collar 77), since the assembly associated with the bushing or collar corresponding to collar 78 is the same. Collar 177 has a radial through bore 180, the inner end **180*a*** of which is of reduced diameter.

A pair of inner and outer abutting bearing assemblies 182 and 192 are received co-axially within bore 180. Bearing assembly 182 extends to the shoulder defined at the junction of bores 180 and **180*a*. Bearing assembly 182 has outer race 182*b* fixed within bore 180, inner race 182*a* and coupling balls 183. Similarly, bearing assembly 192 has fixed outer race 192*b*, balls 193 and inner race 192*a*. Races 192*a* and 182*a* are fixedly mounted upon radial shaft 181. Shaft 181 has an inner cylindrical extension 181*a* of increased diameter which extends clearingly through bore 180*a* and into groove 75 of shaft 50**.

Figures 8, 9, 10:
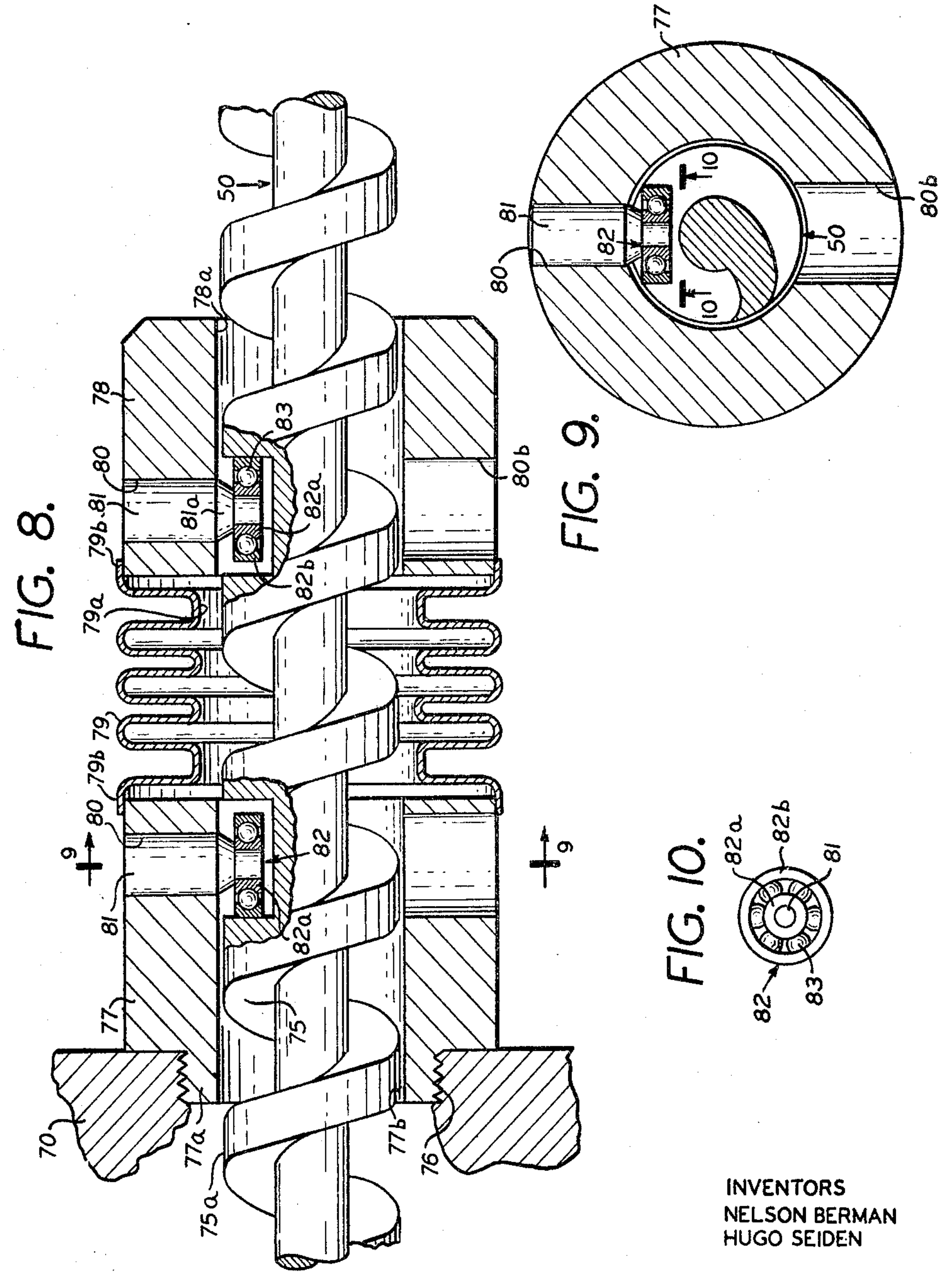
FIG. 8 is a fragmentary detail view similar to FIG. 3, showing the drive shaft assembly in enlarged scale.
FIG. 9 is a section on line 9—9 of FIG. 8.
FIG. 10 is a fragmentary elevational view taken on line 10—10 of FIG. 9.

The operation of the structure of FIG. 11 is essentially the same as the operation of the structure of FIGS. 8–10. In each instance, a radial member is turnable about its axis both with respect to the collar and the shaft groove 75 and is maintained by a spring against the wall of the groove.

Plate 70 has a plurality of through apertures 90 (FIG. 3) extending longitudinally and in respective alignment with tubes 30 and 31. An internally screw-threaded tube or collar 91 is frictionally received within each bore 90 and protrudes rearwardly of plate 70. A screw 92 is screwed into each collar 91 and has a front slot **92*a*. Wall 14 has screw-threaded bores 92*b* in alignment with screws 92** which are ordinarily closed by capping screws 92*c*. Each capping screw 92*c* may be removed from the outside for access to the slot 92*a* of screw 92 for adjustment purposes. Once the trimming is done, screw 92*c* may be replaced and may seal bore 92*b*, either by means of a gasket (not shown) or by soldering screw 92*c* in place, as shown by reference numeral 5.

Stiff longitudinally extending wires 93 are embedded in the screws 92 which are in longitudinal registration with the tubes 30. Stiff wires 94 which extend longitudinally are embedded in the screws 91 which are in alignment with the tubes 31. These wires 93 and 94 are similar except in length, and are sufficiently rigid to prevent buckling thereof in the transport of reactance elements in the manner to be described below. However, the wires 93 and 94 may be flexed transversely resiliently to correct misalignments as described below.

Each wire 93 is associated with a hollow cylindrical metal piston 95 which extends slidably frictionally into the bore of a respective tube 30. Optionally and preferably, as shown in FIG. 6, piston 95 has a longitudinal slot or cut 95*a* extending its full length and is made of spring material. Piston 95 is compressed when inserted in tube 30 and its resiliency maintains it tightly against the wall of the bore of tube 30. Piston 95 has an intermediate transverse metal partition 96 which is fixed thereto by soldering 96*a*. The soldering 96*a* terminates at points circumferentially spaced on either side of cut 95*a* to permit the desired flexing of the wall of tube 95. Wire 93 extends through a hole of partition 96 in piston 95 and is fixed to partition 96 by any suitable means, such as rivet head 93*a* or welding.

It will be apparent that the capacity of the unit depends upon the configuration of coating 36 and upon the longitudinal position of piston 95. In addition, slot 95*a* serves as trimming means to vary the slope of the tuning curve. Thus, illustratively, in the shape of the coating 36 shown in FIG. 3, it is possible to vary the capacity characteristics of the device by varying the turned position of the piston. It will be apparent, for example, that the electrical characteristics will vary depending upon what proportion of the total length of coating is opposed by slot 95.

The construction of the capacitor wall (tube 30) makes it possible for the wall to have an overall thickness of approximately 0.005 inch, with a thin but high coefficient dielectric interposed between the piston and the coating. This makes it possible to miniaturize the tuner size, as compared to the size of a conventional air dielectric tuner.

Each wire 94 is slightly longer than wire 93. Adjacent the rear end of wire 94, it extends into a metal wiper disc 97 of round or circular configuration. The diameter of disc 97 is substantially equal to the diameter of the bore of tube 31 less half the diameter of the wire of coil 32. Upon longitudinal movement of disc 97, it tracks with the wire of coil 32 and continuously wipes against it, with the wire 94 correspondingly oscillating flexibly and resiliently.

The operation of the device should be clear from the foregoing. By turning knob 60, plate 70 is moved axially depending upon the direction of turning of the knob, thereby correspondingly moving the reactance elements 95 and 97. As a result, the reactance of the individual inductance and capacitance elements is varied. Mechanically, in the event that there is any misalignment or in the further event that there are any changes in alignment during the longitudinal movement of plates 70, so as to tend to cause misalignment of the wires 93 relative to the bores of the various tubes 30 and 31, the wires automatically flex in compensation. As a result, it is not necessary to provide precision construction of the plate 70 and its mounting means. Furthermore, individual trimming adjustments of the various reactance elements can readily be obtained by loosening the set screws 92*c* and turning the adjusting screws 92.

Any desired electrical characteristics can be produced. In the embodiment shown in the drawing, it is noted that the change of inductance of an inductance element resulting from the axial movement of plate 70 is inverse to the corresponding change in capacity of a capacity element. By proper shaping of coil 32 and of the conductive coating 36, of electrically coupled capacity and inductance elements, it is possible to maintain a constant ratio between inductance and capacity, as a result of which the resonant frequency is a linear function of control shaft rotation and the impedance of the section is constant at all resonant frequencies. However, it will be understood that the invention is not limited to such an arrangement. It is entirely possible that the invention may be used to vary only capacitance, only inductance or any other combination of capacity and inductances besides that illustrated. There may be additional reactance sections in any other appropriate geometric relationship, so long as they are controlled by plate 70. In certain applications, inductance may be kept constant and only capacity varied. In all instances, an important feature is the use of the stiff wires 93 and 94 adjustably mounted upon plate 70, so as to control the movable reactance elements, thereby eliminating the need for precise alignment of operating parts and permitting close fit of the piston 95 and tube 30 for reduction of microphonics. The specific arrangement of the wiper disc 97 and inductance coil 32 is also highly advantageous as permitting precise control of inductance with good electrical contact throughout the range for operation. It will be apparent that the principle of this construction can also be employed in ganged variable resistances.

It will be apparent that any desired cross sectional configuration of the tuning device may be used, with any desired combinations of inductance and capacity elements. The inductance and capacity elements within compartment 20 may be individually shielded, by any suitable means (not shown), or may be shielded in groups which are to be connected together in circuit, as desired.

While a preferred embodiment of the invention has been disclosed, and various possible changes, omissions and additions have been indicated, it will be apparent that various other changes, omissions and additions can be made in the invention without departing from the scope and spirit thereof.

What is claimed is:

1. In a tuning device of the type described, an inductor comprising a longitudinally extending insulating tube having a generally spiral groove on the wall of its bore, a conducting first wire embedded in said groove and protruding in said bore and being thereby configured to have inductance, a support outside said tube and longitudinally opposing an end of said tube and having a longitudinal opening, a conducting second wire extending slidably into said opening and also into said tube, means releasably locking said second wire in said opening, a conducting disc fixed to said second wire in said tube and of sufficient diameter so that it engages frictionally between said first wire and the wall of said bore, said disc having its longitudinal dimension substantially less than the pitch of said groove, means mounting said support and said tube so that they are relatively longitudinally movable, said second wire being stiff but somewhat flexible and resilient so as to move to accommodate tracking movement of said disc along said first wire during relative longitudinal movement of said support and said tube.

2. In a tuning device of the type described, an inductor comprising an insulating tube having an axis and having a bore and having a generally spiral groove on the wall of its bore, a conducting first wire embedded in said groove and protruding into said bore and being thereby configured to have inductance, a conducting second wire, said second wire being disposed coaxially with said tube and axially and slideably moveable with respect thereto to extend into and out of said tube, means supporting said tube and said second wire, a conducting disc fixed to said second wire in said tube and of sufficient diameter so that it engages frictionally between said first wire and the wall of said bore, said disc having its longitudinal dimension substantially less than the pitch of said groove, said second wire being stiff but somewhat flexible and resilient so as to move to accommodate tracking movement of said disc along said first wire during relative axial movement of said wire and said tube.

References Cited by the Examiner

UNITED STATES PATENTS

| | | | |
|---|---|---|---|
| 1,618,058 | 2/1927 | Church | 338—92 X |
| 2,423,275 | 7/1947 | Wandrey | 336—136 |
| 2,466,201 | 4/1949 | Boudreaux | 200—136 X |
| 2,483,105 | 9/1949 | Rennick | 336—136 |
| 2,649,577 | 8/1953 | Armstrong | 336—144 X |

LARAMIE E. ASKIN, *Primary Examiner.*

ROBERT K. SCHAEFER, *Examiner.*

W. M. ASBURY, *Assistant Examiner.*